(12) United States Patent
Furuta et al.

(10) Patent No.: US 7,660,085 B2
(45) Date of Patent: Feb. 9, 2010

(54) SEMICONDUCTOR DEVICE

(75) Inventors: Hiroshi Furuta, Kanagawa (JP); Kenji Hibino, Kanagawa (JP); Hidetaka Natsume, Kanagawa (JP); Toshikatsu Jinbo, Kanagawa (JP); Kiyokazu Hashimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 325 days.

(21) Appl. No.: 11/358,226

(22) Filed: Feb. 22, 2006

(65) Prior Publication Data

US 2006/0187733 A1 Aug. 24, 2006

(30) Foreign Application Priority Data

Feb. 23, 2005 (JP) ............................. 2005-046457

(51) Int. Cl.
*H02H 3/22* (2006.01)
(52) U.S. Cl. ......................................... 361/56; 361/111
(58) Field of Classification Search .................. 361/56, 361/111; 257/355
See application file for complete search history.

(56) References Cited

U.S. PATENT DOCUMENTS

| 5,079,612 | A |   | 1/1992 | Takamoto et al. |         |
|-----------|---|---|--------|-----------------|---------|
| 5,189,588 | A |   | 2/1993 | Yano et al.     |         |
| 5,416,661 | A | * | 5/1995 | Furuta          | 361/56  |
| 5,535,084 | A | * | 7/1996 | Nakayama        | 361/56  |
| 5,612,920 | A | * | 3/1997 | Tomishima       | 365/226 |
| 5,724,219 | A | * | 3/1998 | Narita          | 361/111 |
| 5,821,804 | A | * | 10/1998| Nikutta et al.  | 327/382 |
| 6,291,879 | B1|   | 9/2001 | Yamano          |         |
| 6,521,951 | B2| * | 2/2003 | Sato et al.     | 257/355 |
| 6,535,368 | B2| * | 3/2003 | Andresen et al. | 361/56  |
| 6,710,991 | B2| * | 3/2004 | Kato            | 361/56  |
| 7,072,158 | B2| * | 7/2006 | Wang            | 361/56  |
| 2006/0152870 | A1| * | 7/2006 | Chen et al.  | 361/56  |

FOREIGN PATENT DOCUMENTS

| JP | 2-307258  | 12/1990 |
| JP | 3-027566  | 2/1991  |
| JP | 3-072666  | 3/1991  |
| JP | 4-048773  | 2/1992  |
| JP | 11-297939 | 10/1999 |

OTHER PUBLICATIONS

C. Duvvury et al., "Internal Chip ESD Phenomena Beyond the Protection Circuit," IEEE Transactions on Electronic Devices, vol. 35:12, 1998, pp. 2133-2139.

* cited by examiner

*Primary Examiner*—Danny Nguyen
(74) *Attorney, Agent, or Firm*—Foley & Lardner LLP

(57) ABSTRACT

A conventional layout of power supply protective element cannot sufficiently protect an internal circuit against a surge current that flows into a narrow branch line that branches off from a thick main wiring line. A semiconductor device according to an embodiment of the present invention includes a power supply protective element connected around a terminal; a main wiring line connected with a VCC pad or a GND pad; a branch line that branches off from the main wiring line and applies a power supply potential or a ground potential to a functional block of the semiconductor device; a branching portion at which the branch line branches off from the main wiring line; and an internal power supply protective element connected with the branch line.

11 Claims, 15 Drawing Sheets

RELATEDT ART

RELATEDT ART

SEMICONDUCTOR DEVICE

BACKGROUND OF THE INVENTION

1. Field of the Invention

The present invention relates to a semiconductor device. In particular, the invention relates to a semiconductor device capable of preventing electrostatic breakdown with an internal power supply protective element connected with a branch line.

2. Description of Related Art

In recent years, semiconductor integrated circuits have made a progress toward miniaturizing elements to improve a function and performance of a device. However, a semiconductor device composed of miniaturized elements has a problem that the device is easily broken when being subjected to electrostatic discharge (ESD). If an element is subject to the ESD, a surge (for example, abnormal voltage and current) is applied to the element. The breakdown of a semiconductor element due to the surge implies ESD breakdown. A semiconductor integrated circuit device is thus required to withstand the ESD breakdown. The principle of the ESD breakdown of the element is disclosed in IEEE Transactions on electron devices, vol. 35, No. 12, 1998, pp. 2133-2139, CHARVAKA DUVVURY et al. 'Internal Chip ESD Phenomena Beyond the Protection Circuit'.

As disclosed in IEEE Transactions on electron devices, vol. 35, No. 12, 1998, pp. 2133-2139, CHARVAKA DUVVURY et al. 'Internal Chip ESD Phenomena Beyond the Protection Circuit', even though a surge current is prevented from flowing into an internal circuit by use of a power supply protective element connected between a power supply and a ground terminal to suppress a voltage applied to the internal circuit, elements of the internal circuit cannot be protected from breakdown. That is, even if the power supply protective element prevents a surge current from flowing into the internal circuit, short-circuiting occurs between a gate and a drain of a MOSFET unless a surge current flows through an expected path. FIG. 10 shows a surge current path in the case where a surge current is supplied from a power supply terminal to flow into a ground terminal by way of an internal circuit. In the illustrated example of FIG. 10, an internal circuit 1001 breaks down. FIG. 11 shows a surge current path where a surge current is supplied from an input/output terminal of a semiconductor device to flow into a power supply terminal by way of an internal circuit. Also in the illustrated example of FIG. 11, the internal circuit 1101 breaks down.

To that end, many input protective elements and circuits, output protective elements and circuits, and power supply protective elements and circuits have been proposed for increasing an ESD breakdown voltage. A diode, a gg-NMOS (grounded gate-NMOS), and an SCR (silicon controlled rectifier) have been generally used as the power supply protective elements. These power supply protective elements function to discharge a surge current to paths outside the internal circuit to suppress a voltage applied to the internal circuit when a surge is applied to a device. Further, as a countermeasure against a surge applied during the device operation, an active power supply protective element that discharges a surge current to paths outside the internal circuit to prevent a voltage increase of the internal circuit upon the device operation is used in some cases.

However, there is a problem that the protective element cannot exert a protective function sufficiently depending on the layout of the power supply protective elements. FIGS. 12A to 12F schematically show a conventional layout of protective elements. FIG. 13 shows a schematic two-dimensional layout of conventional protective elements. The conventional power supply protective elements dispose typically a portion near the semiconductor device terminal and main wiring thereof.

Based on the above, Japanese Unexamined Patent Application Publication No. H02-307258 discloses a technique of dispose power supply protective elements at both of a portion near a terminal and a portion near an internal circuit if wiring lines of the semiconductor device have impedance. However, Japanese Unexamined Patent Application Publication No. H02-307258 discloses no specific layout of the protective elements, so the layout depends on designer's know-how. Further, Japanese Unexamined Patent Application Publication Nos. H03-72666 and H04-48773 disclose a technique of connecting not only between a power supply terminal and a ground terminal but other terminals using the power supply protective elements. However, even the technique disclosed in Japanese Unexamined Patent Application Publication Nos. H03-72666 and H04-48773 has a problem in that the internal circuit cannot be reliably protected since the power supply protective elements are arranged merely around the terminals of the semiconductor device. Japanese Unexamined Patent Application Publication Nos. H03-27566 and H11-297939 disclose a technique of connecting between a power supply line and a ground line using plural power supply protective elements to reduce an apparent impedance of the power supply protective elements. However, even the techniques disclosed in Japanese Unexamined Patent Application Publication Nos. H03-27566 and H11-297939 face a problem that it is difficult to protect the device from a surge current flowing through a narrow branch line that branches off from a thick main wiring line directly connected with a semiconductor device power supply terminal and a ground terminal thereof.

As a result of verifying the above problems by experiment using a circuit of FIG. 14, in the case of applying a surge between VCC1 pad and GND1 pad by use of a TLP (transmission line pulse) device, an internal inverter group 1401 does not break. However, in the case of applying a surge between VCC2 pad and GND2 pad, the ESD breakdown voltage drops down to 55% of that obtained by applying the surge between VCC1 pad and GND1 pad. In order to obtain a uniform breakdown voltage whichever terminal is used to apply a surge, a gate oxide film should be formed with a large thickness.

Further, in a CDM (charged device model) test for changing a device and then releasing charges from the device, charges are accumulated in an internal element, so a discharge path of the charges is hardly predicted. In the ESD applying test such as a CDM test, a discharge path of charges accumulated in the element includes other elements than the power supply protective elements around the terminal. Thus, even with the above related art, the elements cannot be sufficiently protected.

SUMMARY OF THE INVENTION

A semiconductor device according to an aspect of the present invention includes a power supply protective element connected around a terminal; a main wiring line connected with a VCC pad or a GND pad; a branch line that branches off from the main wiring line and applies a power supply potential or a ground potential to a functional block of the semiconductor device; and an internal power supply protective element connected with the branch line.

According to the semiconductor device of the present invention, an internal power supply protective element is connected with a branch line connected with a functional block in addition to a power supply protective element connected near a terminal, whereby a larger number of discharge paths for a surge current can be provided to prevent an internal circuit from breaking down, which is impossible with the related art.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
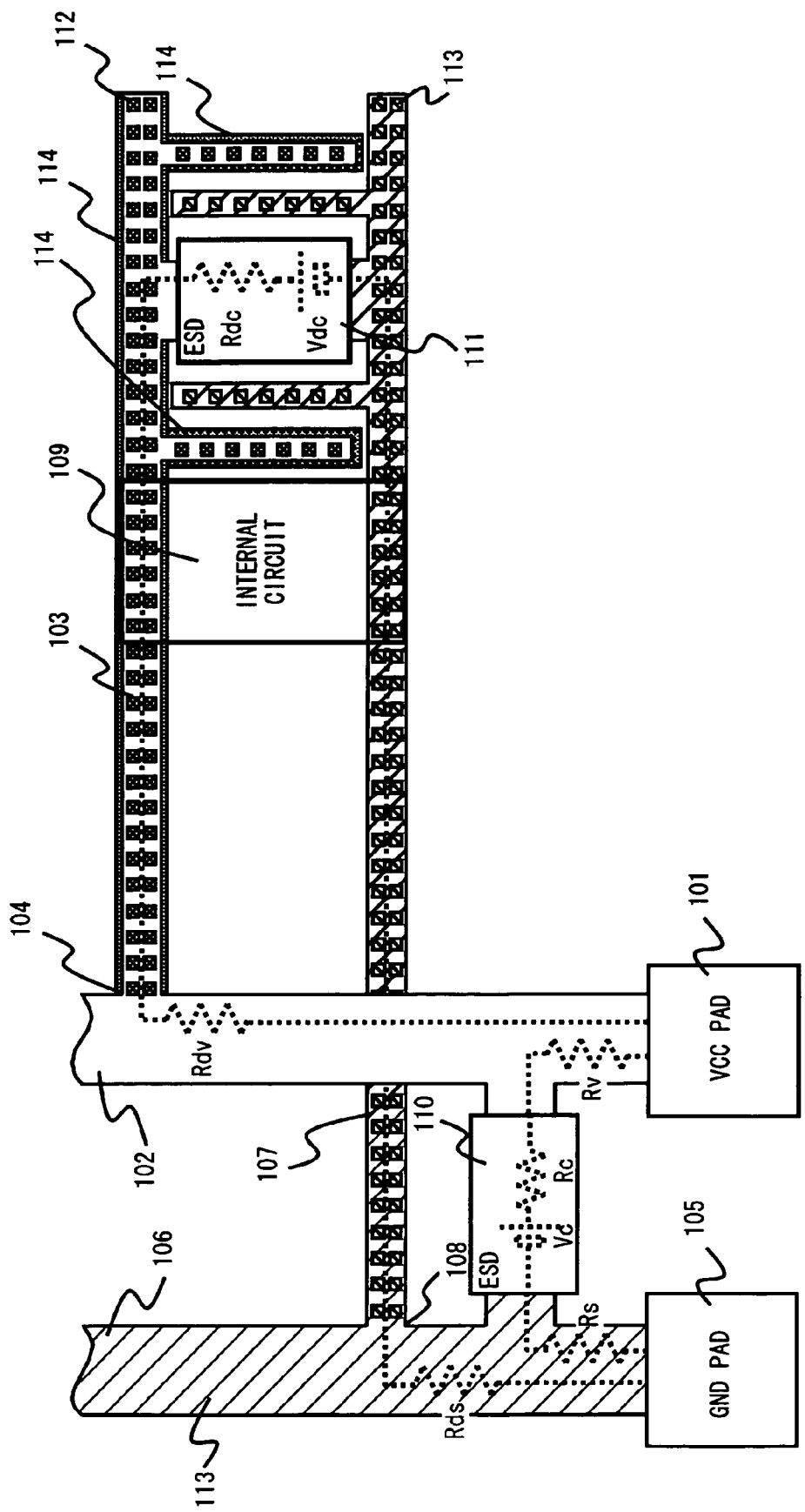
FIG. 1 is a schematic diagram of a layout of power supply protective elements of a semiconductor device according to a first embodiment of the present invention.

FIG. 1 is a schematic diagram of a layout of internal power supply protective elements of a semiconductor device according to a first embodiment of the present invention. A semiconductor of the first embodiment includes a power supply terminal (a first pad or VCC pad) 101, a VCC main wiring line (a first main power source line) 102, a VCC branch line (a first sub power source line) 103, a ground terminal (a second pad or GND pad) 105, a GND main wiring line (a second main power source line) 106, a GND branch line (a second sub power source line) 107, an internal circuit 109, a terminal power supply protective element (a first protection element) 110, an internal power supply protective element (a second protection element) 111, a well contact 112, a sub contact 113, and a well region 114.

The VCC main wiring line 102 having a first node, the first node coupled to the VCC pad 101. The GND main wiring line 106 having a second node, the second node coupled to the GND pad 105. The VCC branch line 103 connected to a third node of the VCC main wiring line 102. The GND branch line 107 connected to a fourth node of the GND main wiring line 106. The internal circuit coupled to the VCC branch line 103 and the GND branch line 107. the terminal power supply protective element coupled to a fifth node between the first and third node of the VCC main wiring line 102 and a sixth node between the second and forth node of the GND main wiring line 106.

The VCC main wiring line 102 is a thick line for applying a power supply potential from the VCC pad 101 to the inside of the semiconductor device. In addition, the VCC branch line 103 is a VCC line that has a smaller width than the VCC main wiring line 102 and branches off from the VCC main wiring line 102 at a branching portion (a third node) 104. The VCC branch line 102 has a portion connected with the well region 114 of the semiconductor device by use of the well contact 112.

The GND main wiring line 106 is a thick line for applying a ground potential from the GND pad 105 to the inside of the semiconductor device. Further, the GND branch line 106 is a GND line that has a smaller width than the GND main wiring line and branches off from the GND main wiring line 105 at a branching portion (a fourth node) 108. The GND main wiring line 106 and the GND branch line 107 have a portion connected with a substrate region of the semiconductor device by use of a sub contact 113.

Here, the term branch line means a line narrower than a main wiring line and almost orthogonal to the main wiring line. Further, the branch line means each of plural lines branching off from the main line. The branch line is narrower than the main wiring line, and thus has higher impedance per unit length than the main wiring line. In addition, the branch line is a line connected with a power supply terminal or ground terminal through the main wiring line and applying a power supply potential or ground potential to a predetermined functional block. That is, the main wiring line applies the power supply potential or the ground potential to plural functional blocks, while the branch line applies the power supply potential or ground potential to a predetermined functional block. The branch line satisfies at least one of the aforementioned conditions.

The internal power supply protective element 111 is connected between the VCC branch line extending from the end of the VCC branch line 103 to the internal circuit 109 and the GND branch line 107 extending from the end of the GND branch line 107 to the internal circuit 109. In addition, the well regions 114 are provided on both sides of the internal power supply protective element 111, and the well regions 114 are connected with a VCC line that further branches off from the VCC branch line 103 by use of the well contact 112. Further, provided in a region between the internal power supply protective element 111 and the well region 114 is a GND line that further branches off from the GND branch line 107, and the sub contact 113 connects the GND branch line 107 with the substrate region of the semiconductor device.

The semiconductor device according to the first embodiment includes an internal power supply protective element 111. The internal power supply protective element 111 is connected between the VCC branch line 103 and the GND branch line 107 when an ESD breakdown voltage of the semiconductor device is below a predetermined reference voltage. A criterion for determining whether to form the internal power supply protective element 111 or not in the semiconductor is described below.

Figure 2:
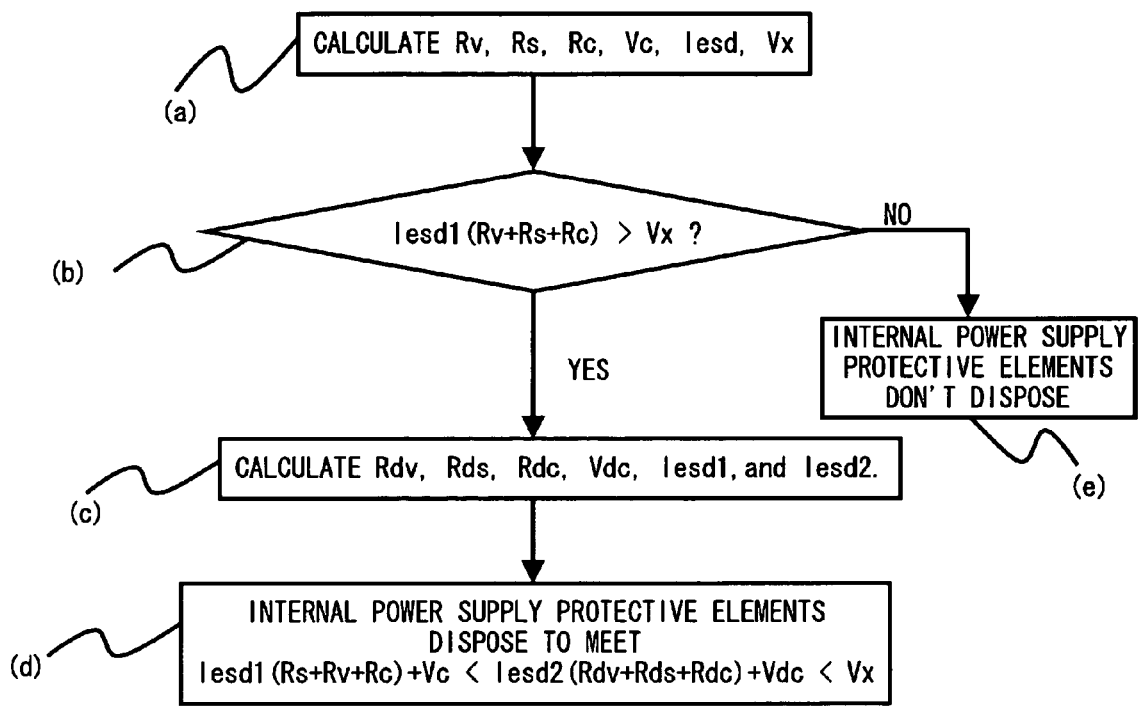
FIG. 2 is a flowchart of a procedure for determining whether or not to form an internal power supply protective element in the semiconductor device according to the first embodiment of the present invention.

FIG. 2 is a flowchart of a procedure for determining whether to form the internal power supply protective element 111 in the semiconductor or not. A criteria for determining whether to form the internal power supply protective element 111 in the semiconductor device or not is determined based on a wiring resistance, characteristics of the terminal power supply protective element 110, and an amount of current that flows at the time of applying a surge.

First, a wiring resistance Rv of the VCC main wiring line 102 (VCC-side expected discharge path) from the VCC pad 101 to the terminal power supply protective element 110, a wiring resistance Rs of the GND main wiring line 106 (GND-side expected discharge path) from the terminal power supply protective element 110 to the GND pad 105, a clamp voltage Vc of the terminal power supply protective element 110, an effective resistive component Rc during the operation of the terminal power supply protective element 110, a gate oxide film breakdown voltage Vx of an element of the internal circuit 109, and a current Iesd that flows from the VCC pad 101 to the GND pad 105 through the terminal power supply protective element 110 at the time of applying a surge are respectively determined. The above values are calculated using, for example, CAD tool or simulation tool.

When the thus-determined values meet Expression 1 below, the internal power supply protective element 111 is formed inside the semiconductor.

$$Iesd(Rv+Rs+Rc)+Vc > Vx \quad \text{Expression 1}$$

If Expression 1 above is not met, the internal power supply protective element is not formed.

Here, Rdv represents a wiring resistance of the VCC main wiring line 102 (VCC-side expected discharge path) from the VCC pad 101 to the branching portion 104 of the VCC main wiring line 102, Rds represents a wiring resistance (GND-side expected discharge path) of the GND main wiring line 106 from the GND pad 105 to the branching portion 108 of the GND main wiring line 106, Vdc represents a clamp voltage upon the operation of the internal power supply protective element, Rdc represents an effective resistive component upon the operation of the internal power supply protective element, Iesd1 represents a surge current that flows into the GND pad 105 through the terminal power supply protective element 110 from the VCC pad 101 in the case where the internal power supply protective element 111 is formed, and Iesd2 represents a surge current that flows from the VCC pad 101 through the internal power supply protective element 111 into the GND pad 105. In the case of forming the internal power supply protective element 111 inside the semiconductor device, the internal power supply protective element 111 should have characteristics that meet Expression 2 below.

$$Iesd1(Rv+Rs+Rc)+Vc < Iesd2(Rdv+Rds+Rdc)+Vdc < Vx \quad \text{Expression 2}$$

Here, the VCC branch line 103 is connected with the well region 114 and the well contact 112, so the wiring resistance Rdv is a combined resistance that includes a resistive component of the well region 114. Further, the GND main wiring line 106 and the GND branch line 107 are connected with the substrate region of the semiconductor device and the sub contact, so the wiring resistance Rds becomes a combined resistance that includes a resistive component of the substrate region. Further, Iesd=Iesd1+Iesd2.

If Rv, Rs<<Rc, and Rdv, Rds<<Rdc, Expression 2 is expanded into Expression 3 below.

$$Iesd1 \ast Rc+Vc < Iesd2 \ast Rdc+Vdc \quad \text{Expression 3}$$

Assuming that current Iesd1>Iesd2, an effective resistive component Rdc and clamp voltage Vdc of the internal power supply protective element may be larger than the effective resistive component Rc and the clamp voltage Vc of the terminal power supply protective element. Thus, the internal power supply protective element can be formed with a smaller size than that of the terminal power supply protective element.

Through the above-described procedure, an operation of the semiconductor device at the time of applying a surge due to ESD in such a state that the internal power supply protective element 111 is provided to the VCC branch line 103 or the GND branch line 107 of the semiconductor device is described.

First, an operation of the semiconductor device is described if a surge that is applied to the VCC terminal 101 due to the ESD is small as compared with a GND potential of the GND terminal 105 as a reference. In this case, a current Iesdmin flows into the semiconductor device due to a surge applied from the VCC terminal 101. The current Iesdmin increases a voltage of the terminal, and the terminal power supply protective element 110 operates. When the terminal power supply protective element 110 operates, the current Iesdmin flows into the GND terminal 105 by way of the terminal power supply protective element 110. At this time, a voltage of (Iesdmin*Rc+Vc) is applied across the terminal power supply protective element 110. Furthermore, a voltage Vesdmin (Idesdmin (Rv+Rs+Rc)+Vc) is applied between the GND terminal 105 and the VCC terminal 101. Since an amount of the current Iesdmin is small, the voltage Vesdmin is low. Hence, the internal power supply protective element 111 does not operate yet. Further, the voltage Vesdmin is lower than the gate oxide film breakdown voltage Vx, an internal element never breaks down.

Next, an operation of the device at the time of applying to the VCC terminal 101, a large surge as compared with the GND potential of the GND terminal 105 as a reference voltage is described. In this case, a current Iesdmax flows into the semiconductor device due to the surge applied from the VCC terminal 101. The current Iesdmax increases a voltage of the terminal, and the terminal power supply protective element 110 operates. At this time, a voltage applied across the terminal power supply protective element 110 increases up to a voltage necessary for the terminal power supply protective element 111 to operate. That is, if a large surge is applied to the VCC terminal 101, two protective elements of the terminal power supply protective element 110 and the internal power supply protective element 111 protect elements of the internal circuit.

A current flowing through the terminal power supply protective element 110 is represented by Iesdmax1, and a current flowing through the internal power supply protective element 111 is represented by Iesdmax2. At this time, the voltage Vesdmax generated between the GND terminal 105 and the VCC terminal 101 equals "Iesdmax1 (Rv+Rs+Rc)+Vc, or Iesdmax2 (Rdv+Rds+Rdc)+Vdc. This voltage Vesdmax satisfies the relation of Vesdmax<Vx based on the above explanation.

When a current Iesdmax2 flows into the internal power supply protective element 111, carriers are discharged from the internal power supply protective element 111 into the substrate or well, but the discharged carriers are caught by a well potential diffusion layer 112 or a substrate potential diffusion layer 113 provided between the internal power supply protective element 111 and the internal circuit 109, and thus do not flow into a diffusion layer of an element composing the internal circuit. Nor do the carriers change a well potential or substrate potential near the internal circuit.

Based on the above explanation, according to the semiconductor device of the first embodiment, when a large surge is applied to the semiconductor device due to the ESD, the two protective elements, that is, the terminal power supply protective element 110 and the internal power supply protective element 111 protect elements of the internal circuit 109. In order to discharge all charges that flow into the semiconductor device due to the ESD, by use of the terminal power supply protective element 110 for the purpose of protecting the internal circuit 109, the terminal power supply protective element 110 should be enlarged. However, if a voltage across the terminal power supply protective element 110 is lowered while a large amount of current flows, an area of the terminal power supply protective element drastically increases. In contrast thereto, in the semiconductor device of the first embodiment, the internal circuit 109 to be protected is specified based on a predetermined size of the terminal power supply protective element 110 using the CAD tool or simulation tool, and the internal power supply protective element 111 smaller than the terminal power supply protective element 110 is provided to the specified internal circuit 109. Hence, it is possible to increase the ESD breakdown voltage of the semiconductor device and minimize an area of the semiconductor device.

Second Embodiment

Figure 3:
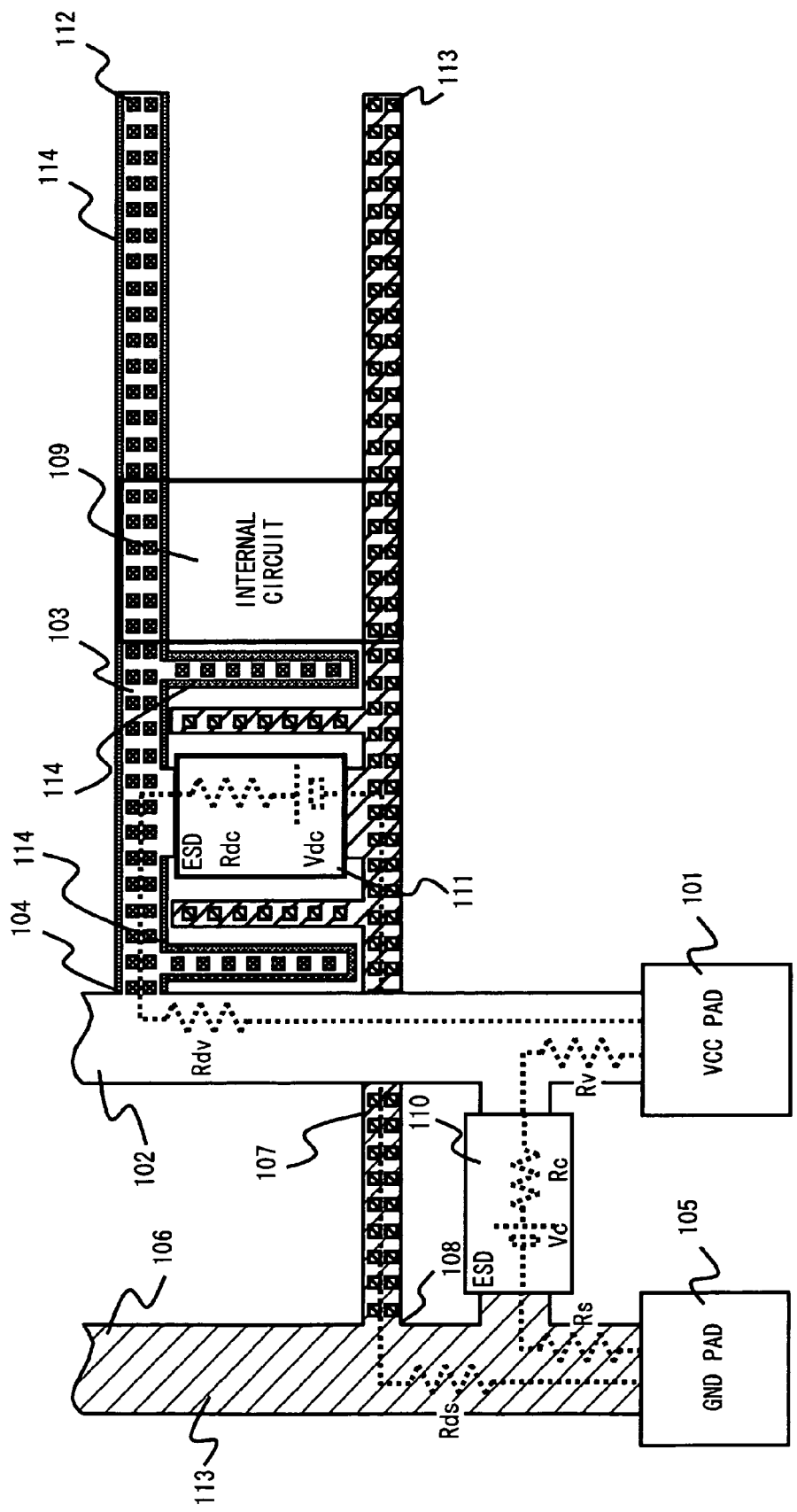
FIG. 3 is a schematic diagram of a layout of power supply protective elements of a semiconductor device according to a second embodiment of the present invention.

FIG. 3 is a schematic diagram of a layout of internal power supply protective elements of the semiconductor device according to a second embodiment of the present invention. The semiconductor device of the second embodiment is basically the same as that of the first embodiment except that in the semiconductor device of the first embodiment, the internal power supply protective elements are connected with a branch line from the internal circuit and the end of a branch line, but in the semiconductor device of the second embodiment, the internal power supply protective elements are connected with a branch line from a branching portion of the branch line and the internal circuit.

In the second embodiment, the same components as those of the first embodiment are denoted by like reference numerals, and the repetitive description thereof is omitted. Further, the first embodiment differs from the second embodiment only in terms of the connection form of the internal power supply protective elements, and an operation of the device is the same, so the description of the operation is omitted. Accordingly, the following description is directed to a difference in semiconductor device operation at the time of applying the ESD due to the different connection forms.

In the second embodiment, the internal power supply protective element 111 is connected with branch lines 103 and 107 between the branching portions 104, and 108, and the internal circuit 109. At this time, if a large surge is applied due to the ESD, the internal power supply protective element 111 operates to protect the internal circuit 109 from an excessive amount of current and an excessive voltage. In the first embodiment, the surge current flows through a VCC branch line 112 and a GND branch line 113 of the internal circuit 109. At this time, if a protective ability of the internal power supply protective element 111 is not enough to resist the breakdown voltage of the internal circuit 109, or the breakdown voltage varies from one internal element to another, the internal circuit may break down. In contrast thereto, the internal power supply protective elements 111 of the second embodiment are connected with branch lines 103 and 107 between the branching portions 104, and 108, and the internal circuit 109. That is, the surge current flows into the internal power supply protective element 111 not through wiring lines of the internal circuit 109. This gives a solution to the problems regarding a relation between the protective ability of the protective element and the breakdown voltage of the element of the first embodiment. The first embodiment differs from the second embodiment only in terms of the connection form of the internal power supply protective elements 111, so this solution involves no increase in area.

Third Embodiment

Figure 4:
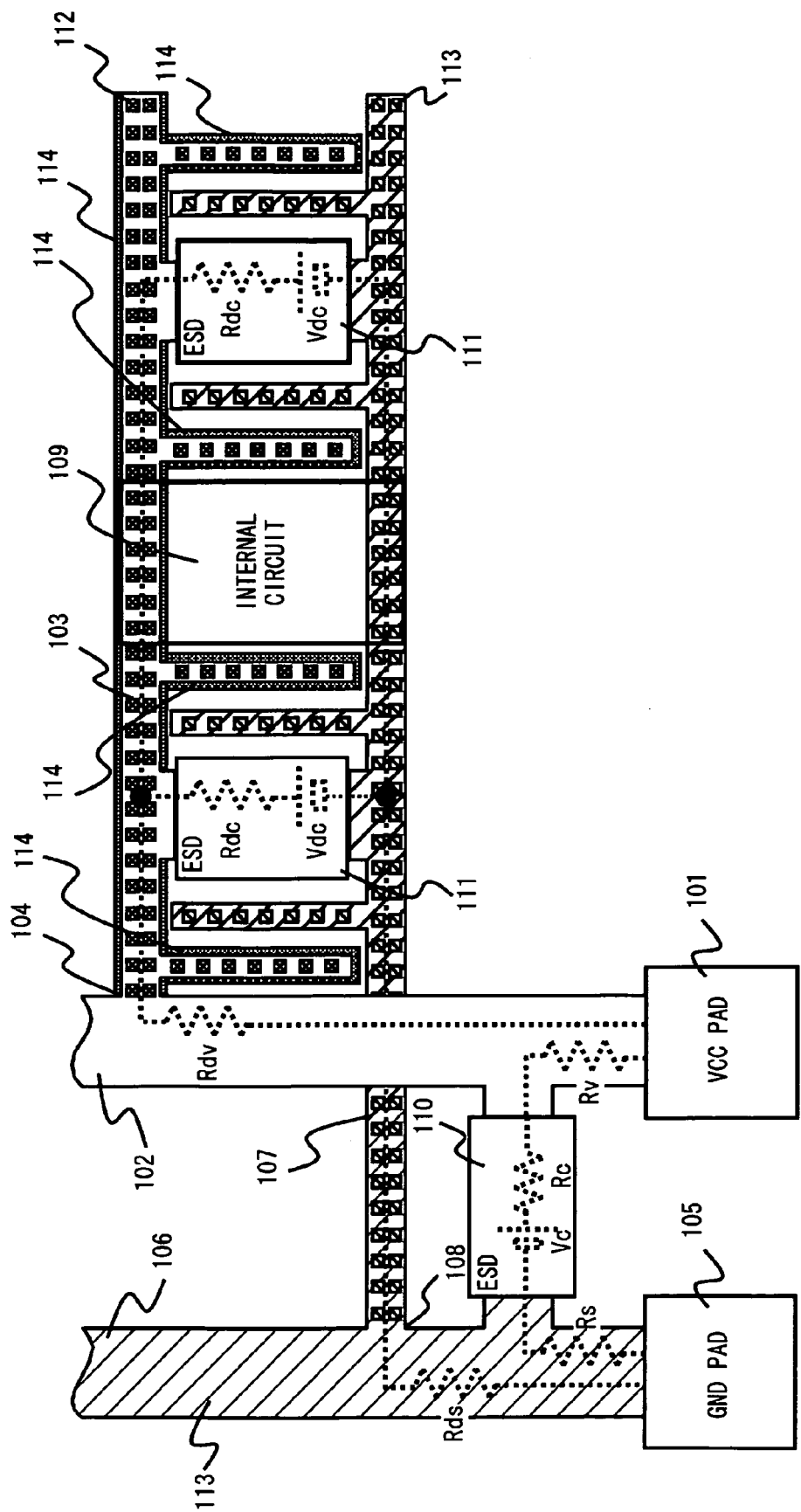
FIG. 4 is a schematic diagram of a layout of power supply protective elements of a semiconductor device according to a third embodiment of the present invention.

FIG. 4 is a schematic diagram of a layout of internal power supply protective elements of a semiconductor device according to a third embodiment of the present invention. The semiconductor device of the third embodiment is substantially the same as the semiconductor device of the first embodiment. In the semiconductor device of the first embodiment, internal power supply protective elements are connected with branch lines between the internal circuit and ends of branch lines, while in the semiconductor device of the third embodiment, internal power supply protective element is connected with branch lines between branching portions of the branch lines and the internal circuit, in addition to the internal power supply protective element connected in the first embodiment.

In the third embodiment, the same components as those of the first embodiment are denoted by like reference numerals, and the repetitive description thereof is omitted. Further, the first embodiment differs from the third embodiment only in terms of the connection form of the internal power supply protective elements, and an operation of the device is the same, so the description of the operation is omitted. Accordingly, the following description is directed to a difference in semiconductor device operation at the time of applying the ESD due to the different connection forms.

In the third embodiment, a first internal power supply protective element is connected with a branch line between the internal circuit 109 and branching portions 104 and 108 of the branch lines 103 and 107. A second internal power supply protective element is connected with a branch line between the internal circuit 109 and ends of the branch lines 103 and 107. At this time, if a large surge is applied due to the ESD, the first and second internal power supply protective elements operate to protect the internal circuit 109 from an excessive amount of current and an excessive voltage. In the first embodiment, one internal power supply protective element 111 is provided, while in the third embodiment, two internal power supply protective elements 111 are provided. The first and second internal power supply protective elements operate in parallel. That is, an amount of current that flows into each internal power supply protective element 111 is smaller than an amount of current that flows into one internal power supply protective element 111. Accordingly, a voltage difference between the GND line 107 of the internal circuit 109 and the VCC line 103 can be reduced. Thus, the semiconductor device of the third embodiment can increase the ESD breakdown voltage as compared with the semiconductor device of the first or second embodiment.

Fourth Embodiment

Figure 5:
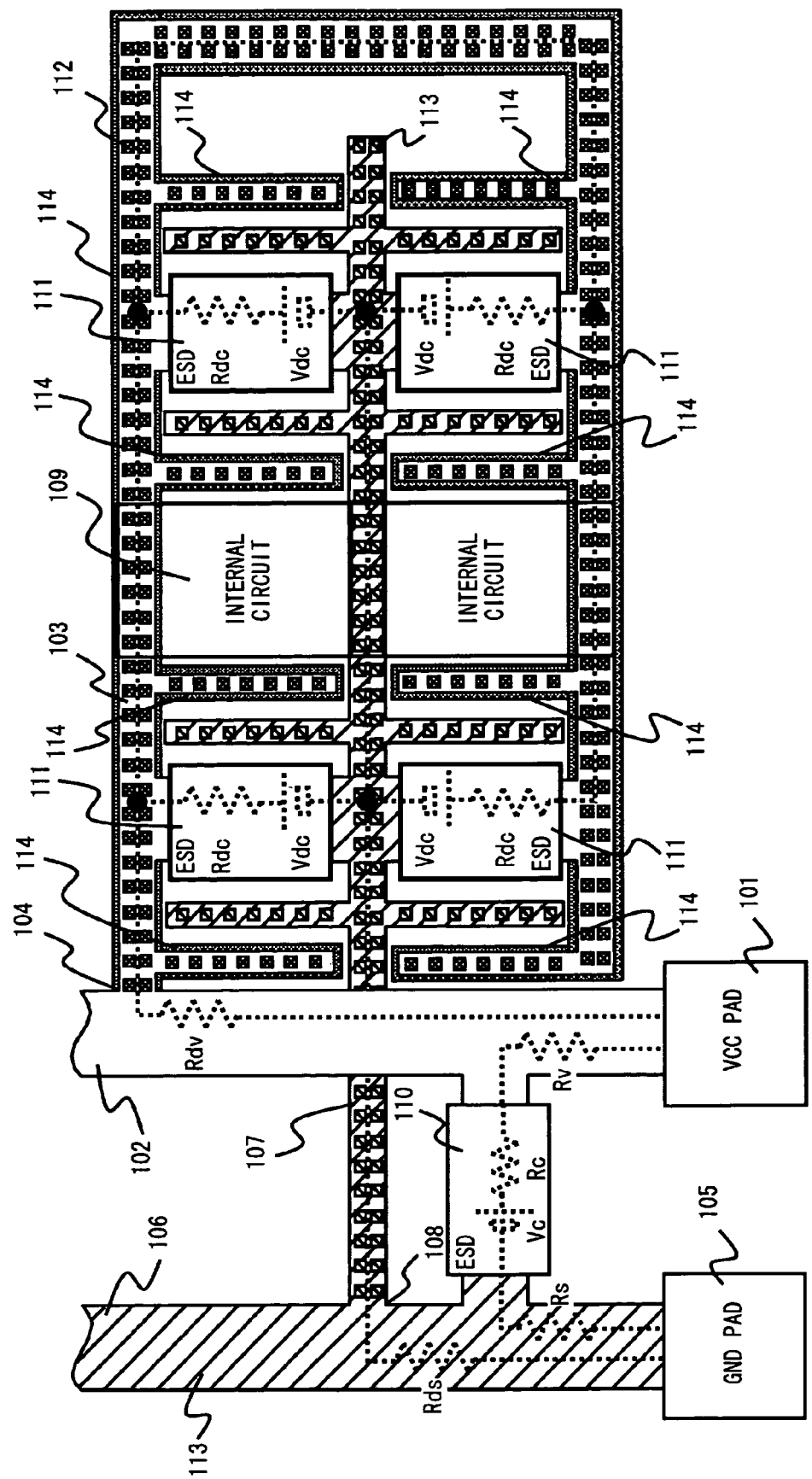
FIG. 5 is a schematic diagram of a layout of power supply protective elements of a semiconductor device according to a fourth embodiment of the present invention.

FIG. 5 is a schematic diagram of a layout of an internal power supply protective element of a semiconductor device according to a fourth embodiment of the present invention. The semiconductor device according to the fourth embodiment is substantially the same as the semiconductor device of the first or third embodiment. A difference between the fourth embodiment and the first or third embodiment is that the semiconductor device of the first or third embodiment has an internal circuit connected with a branch line, while the semiconductor device of the fourth embodiment has two internal circuits connected with a pair of branch lines. In the fourth embodiment, two internal circuits are connected with a pair of branch lines, but if plural internal circuits are connected with a pair of branch lines, their operations are substantially the same as the above case.

In the fourth embodiment, the same components as those of the first embodiment are denoted by like reference numerals, and their description is omitted here. Further, the first embodiment differs from the fourth embodiment only in terms of a connection form of the internal power supply protective elements; the device operation is the same. Hence, description about the device operation is omitted and the following description is directed to a difference in ESD breakdown voltage due to the different connection forms.

In the fourth embodiment, a first internal power supply protective element is connected between a first internal circuit and a branching portion of a branch line. Further, second and third internal power supply protective elements are connected between the first internal circuit and a second internal circuit, and a fourth internal power supply protective element is connected between the second internal circuit and an end of the branch line. At this time, if a large surge is applied due to the EST, the first to fourth internal power supply protective elements operate to protect an internal circuit from an excessive amount of current and an excessive voltage. In the fourth embodiment, one internal power supply protective element is provided, while in the fourth embodiment, four internal power supply protective elements are provided. The first to fourth internal power supply protective elements operate in parallel. That is, an amount of current that flows into each internal power supply protective elements is smaller than an amount of current that flows into one internal power supply protective element. Accordingly, a voltage difference between the GND line and the VCC line of the internal circuit can be reduced. Thus, the semiconductor device of the fourth embodiment can increase the ESD breakdown voltage as compared with the third embodiment.

Fifth Embodiment

Figure 6:
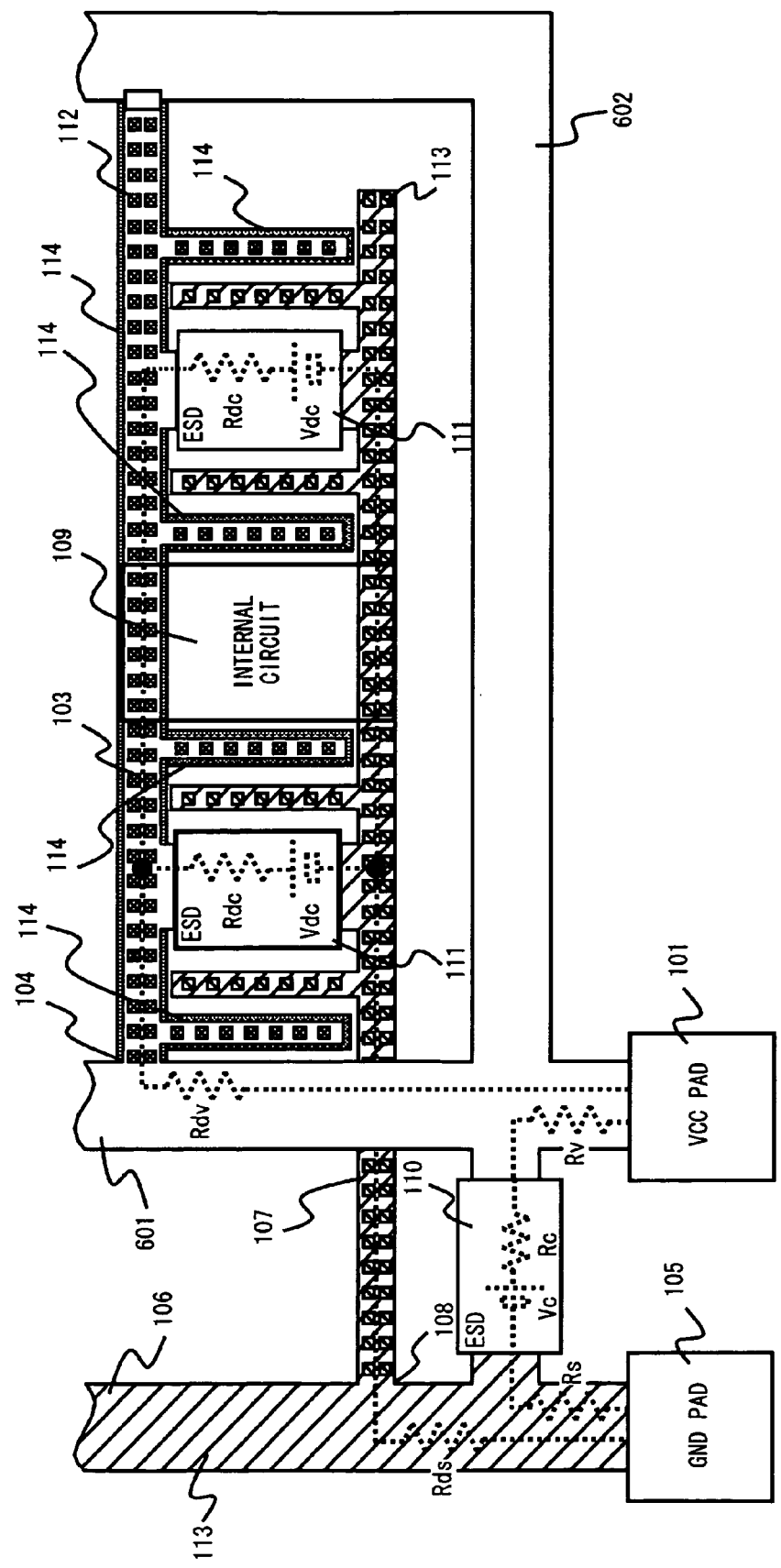
FIG. 6 is a schematic diagram of a layout of power supply protective elements of a semiconductor device according to a fifth embodiment of the present invention.

FIG. 6 is a schematic diagram of a layout of internal power supply protective elements of a semiconductor device according to a fifth embodiment of the present invention. The semiconductor device of the fifth embodiment is substantially the same as the semiconductor device of the third embodiment. A difference between the third embodiment and the fifth embodiment is that the semiconductor device of the third embodiment has one VCC main wiring line, while the semiconductor device of the third embodiment has a first VCC main wiring line and a second VCC main wiring line connected with the first VCC main wiring line, and one end of the VCC branch line is connected with the first VCC main wiring line, and the other end thereof is connected with the second VCC main wiring line.

In the fifth embodiment, the same components as those of the third embodiment are denoted by like reference numerals, and their description is omitted here. The third embodiment differs from the fifth embodiment only in terms of a connection form of the VCC branch lines; the device operation is the same, so description about the device operation is omitted. Accordingly, the following description is directed to a difference in ESD breakdown voltage due to the different connection forms.

In the fifth embodiment, a first internal power supply protective element is connected with a branch line between an internal circuit and a branching portion on the first VCC main wiring line side. A second internal power supply protective element is connected with a branch line between the internal circuit and a branching portion on the second VCC main wiring line side. At this time, if a large surge is applied due to the ESD, the first and second internal power supply protective elements operate to protect the internal circuit from an excessive amount of current and an excessive voltage. In the first embodiment, one internal power supply protective element is provided, while in the fifth embodiment, two internal power supply protective elements are provided. The first and second internal power supply protective elements operate in parallel. That is, an amount of current that flows into each of the internal power supply protective elements is smaller than an amount of current that flows into one internal power supply protective element. Therefore, a voltage difference between the GND line and the VCC line of the internal circuit can be reduced. Hence, the semiconductor device of the fifth embodiment enables the ESD breakdown voltage equivalent to that of the third embodiment. Further, there are two different VCC main lines, so the degree of freedom of a layout of the VCC lines in the semiconductor device is increased to enhance the degree of freedom in design. In the fifth embodiment, two VCC main wiring lines are arranged, but the main wiring lines may be either the VCC main wiring lines or GND main wiring lines. Further, the main wiring lines extend through plural routes.

Sixth Embodiment

Figure 7:
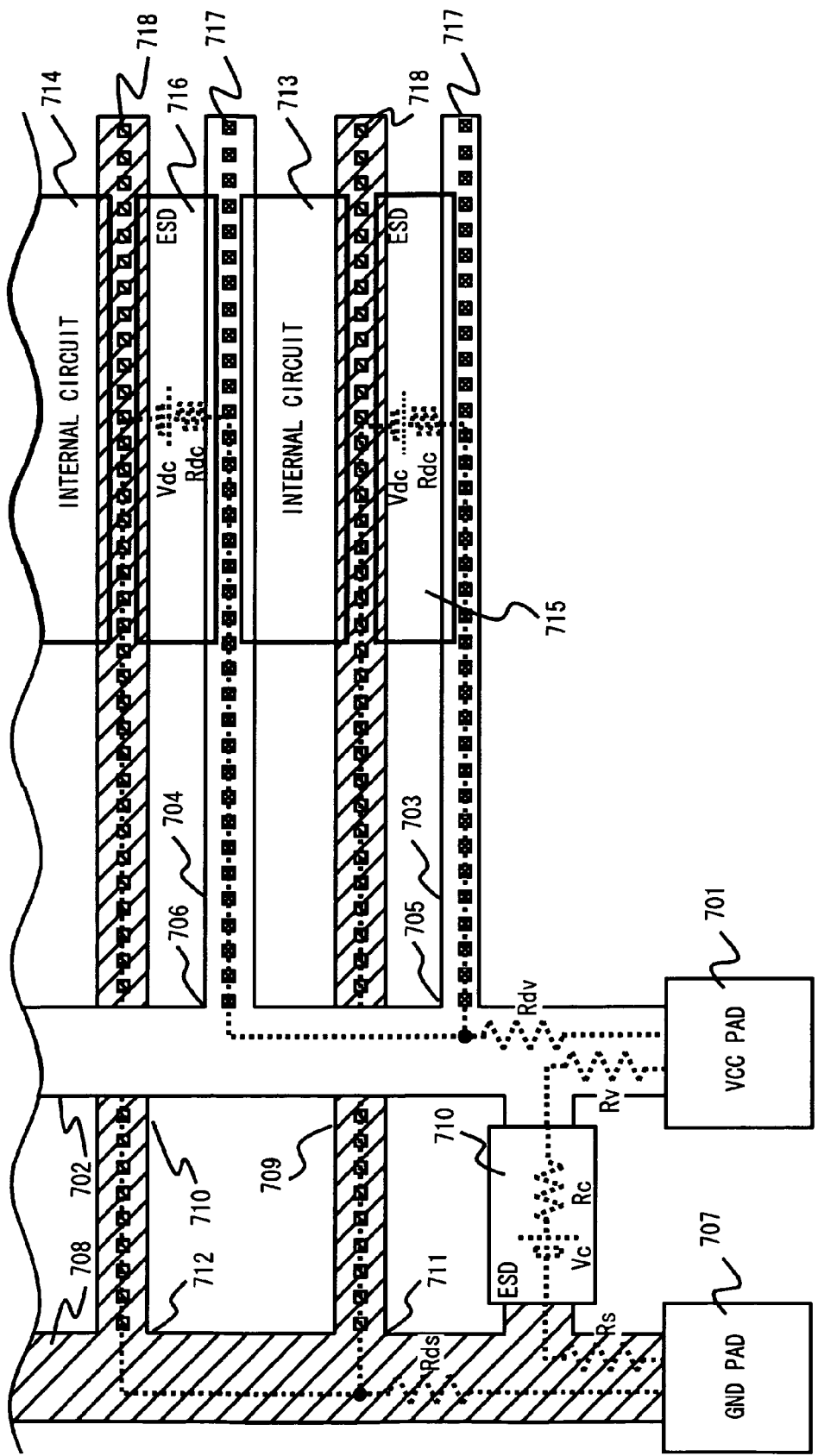
FIG. 7 is a schematic diagram of a layout of power supply protective elements of a semiconductor device according to a sixth embodiment of the present invention.

FIG. 7 is a schematic diagram of internal power supply protective elements of a semiconductor device according to a sixth embodiment of the present invention. The semiconductor device of the sixth embodiment includes a VCC PAT 701, a VCC main wiring line 702, a first VCC branch line 703, a second VCC branch line 704, a GND pad 707, a GND main wiring line 708, a first GND branch line 709, a second GND branch line 710, a first internal circuit 713, a second internal circuit 714, a first internal power supply protective element 715, a second internal power supply protective element 716, a well contact 717, a sub contact 718, and a well region (not shown).

The first internal power supply protective element 715 is connected between the first VCC branch line 703 and the first GND branch line 709, and the first GND branch line 709 applies a ground potential to the first internal circuit 713. The first GND branch line 709 has a sub contact 718 between the first internal power supply protective element 715 and the first internal circuit 713.

Further, the first VCC branch line 703 has a well contact 717 in a portion not overlapping with the first internal power supply protective element 715, and has a well region (not shown) in a region underlying the first VCC branch line 703 and including the well contact 717.

The second internal power supply protective element 716 is connected between the second VCC branch line 704 and the second GND line 710, and the second GND branch line 710 applies a ground potential to the second internal circuit. The second GND branch line 710 has the sub contact 718 between the second internal power supply protective element 716 and the second internal circuit 714.

Further, the second VCC branch line 704 applies a power supply potential to the first internal circuit 713. The second VCC branch line 704 has a well contact 717 between the second internal power supply protective element 716 and the first internal circuit 713, and has a well region in a region underlying the second VCC branch line 704 and including the well contact 717.

An operation of the semiconductor device of the sixth embodiment is substantially the same as that of the first embodiment, so its description is omitted here.

In the semiconductor device of the sixth embodiment, an internal power supply protective element is connected between a VCC branch line connected with an internal circuit to be protected and a GND branch line connected with another internal circuit. Based on such arrangement, if gg-NMOS internal power supply protective elements are used, for example, the gg-NMOS transistors dispose along the GND branch line and the VCC branch line, whereby the gg-NMOS transistors with a large gate length can be formed. The gg-NMOS transistors with a large gate length have an ability to send a large amount of current and thus are desirable as a power supply protective elements. That is, if the internal circuit and the internal power supply protective elements dispose as in the sixth embodiment, a semiconductor device having a high resistance to the ESD can be realized. In addition, according to the layout of the sixth embodiment, the internal power supply protective elements are arranged in a portion between the GND branch line and the VCC branch line, which is wasted in the related art, so a wasted area can be reduced to enable an efficient layout.

Seventh Embodiment

Figure 8:
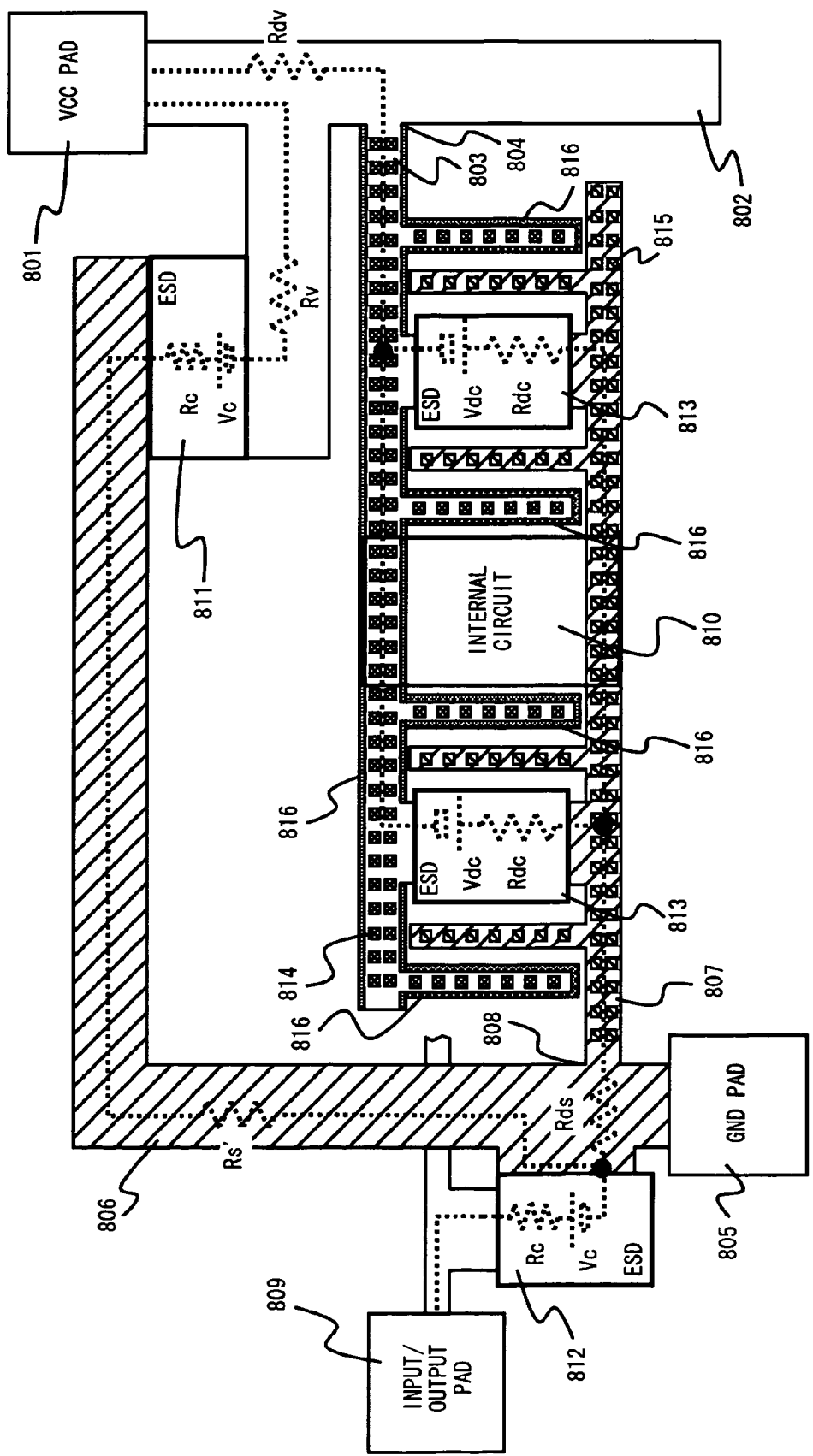
FIG. 8 is a schematic diagram of a layout of power supply protective elements of a semiconductor device according to a seventh embodiment of the present invention.

FIG. 8 is a schematic diagram of a layout of internal power supply protective elements of a semiconductor device according to a seventh embodiment of the present invention. The semiconductor device of the seventh embodiment includes a VCC pad 801, a VCC main wiring line 802, a VCC branch line 803, a VCC branching portion 804, a GND pad 805, a GND main wiring line 806, a GND branch line 807, a GND branching portion 808, an input/output pad 809, an internal circuit 810, a terminal power supply protective element 811, an input/output terminal protective element 812, an internal power supply protective element 813, a well contact 814, a sub contact 815, and a well region 816.

The terminal power supply protective element 810 is connected between the VCC main wiring line 802 connected with the VCC pad 801 and the GND pad 805.

The VCC main wiring line 802 is a thick line for supplying a power supply potential to the inside of the semiconductor device from the VCC pad 801. Further, the VCC branch line 803 is a VCC line that branches off from the VCC main wiring line 802 at a branching portion 804 and is narrower than the VCC main wiring line 802. The VCC branch line 803 has a portion connected with the well region 114 of the semiconductor device by use of the well contact 112.

The GND main wiring line 806 is a thick line for applying a ground potential from the GND pad 805 to the inside of the semiconductor device. Further, the GND branch line 807 is a GND line that branches off from the GND main wiring line 805 at a branching portion 808 and is narrower than the GND main wiring line. The GND main wiring line 806 and the GND branch line 807 has a portion connected with a substrate region of the semiconductor device by use of the sub contact 113.

The input/output pad 809 is a terminal connected with the internal circuit and inputting/outputting signals of the semiconductor device. An input/output terminal protective element 812 is connected between the input/output pad 809 and the GND main wiring line 806.

The internal circuit 810 is connected between the VCC branch line 803 and the GND branch line 807. The internal power supply protective elements 813 are provided on both sides of the internal circuit 810 and between the VCC branch line 803 and the GND branch line 807. Further, substrate regions on both sides of the internal power supply protective elements 813 are applied with a ground potential from the GND branch line 807 and the sub contact 815. The well regions 816 are formed on both sides of the internal power supply protective elements 813 and beyond the GND branch line 807 having the sub contact 815. Each well region 816 is connected with the VCC branch line 803 by use of the well contact and held at a power supply potential.

In the semiconductor device of the seventh embodiment as well, whether or not to form an internal power supply protective element can be determined based on substantially the same procedure as that of the first embodiment. Further, if applied with a surge as a result of the ESD, the semiconductor device of the seventh embodiment operates similar to the first embodiment.

According to the semiconductor device of the seventh embodiment, a large surge is applied to the input/output pad 809 due to the ESD, a surge current flows into the semiconductor device by way of the input/output terminal protective element 812 to protect the elements of the internal circuit by use of the terminal power supply protective element 110 and the internal power supply protective element 111. That is, even if a large surge is applied from the input/output pad, as in the first to sixth embodiments, the semiconductor device of the seventh embodiment can protect the elements of the internal circuit.

The seventh embodiment describes the input/output terminal protective element connected with the GND main wiring line from the input/output pad, but an input/output terminal protective element connected to the VCC main wiring line from the input/output pad can protect elements like the seventh embodiment.

The present invention is not limited to the above embodiment, and can be modified as appropriate. According to the present invention, if a calculation result suggests that the internal circuit cannot be protected by the terminal power supply protective element alone, it suffices that an internal power supply protective element is connected with a branch line connected with the internal circuit. That is, a semiconductor device having the internal power supply protective element connected with the branch line does not put weight on a positional relationship between the internal circuit and the internal power supply protective elements, and the number of internal power supply protective elements. For example, plural power supply protective elements may be provided at the center of the internal circuit. Incidentally, the above embodiments describe the example where the well contact, and the sub contact are provided, but beneficial effects of the present invention can be obtained even if neither the well contact nor the sub contact is provided. Further, in the example described in the embodiments, the internal power supply protective circuit is electrically insulated from the internal circuit by way of a well, but beneficial effects of the present invention can be obtained even if these are not electrically insulated from each other.

Figure 9:
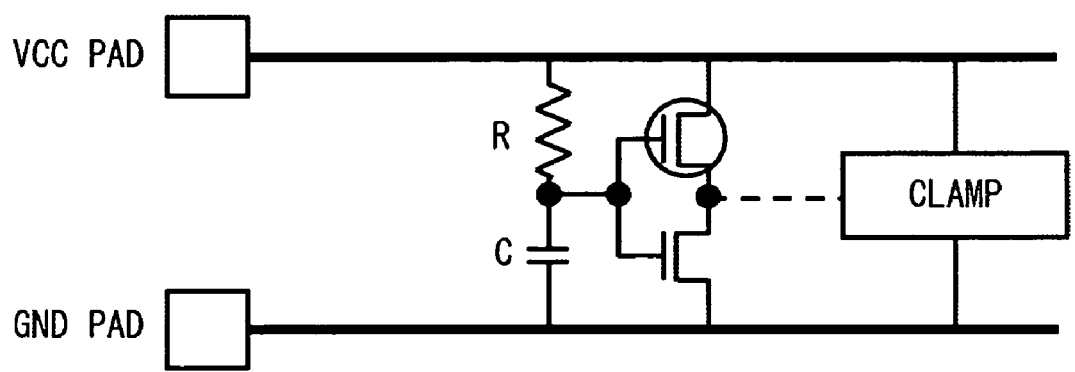
FIG. 9 shows an example of an active protective element.
Figure 10:
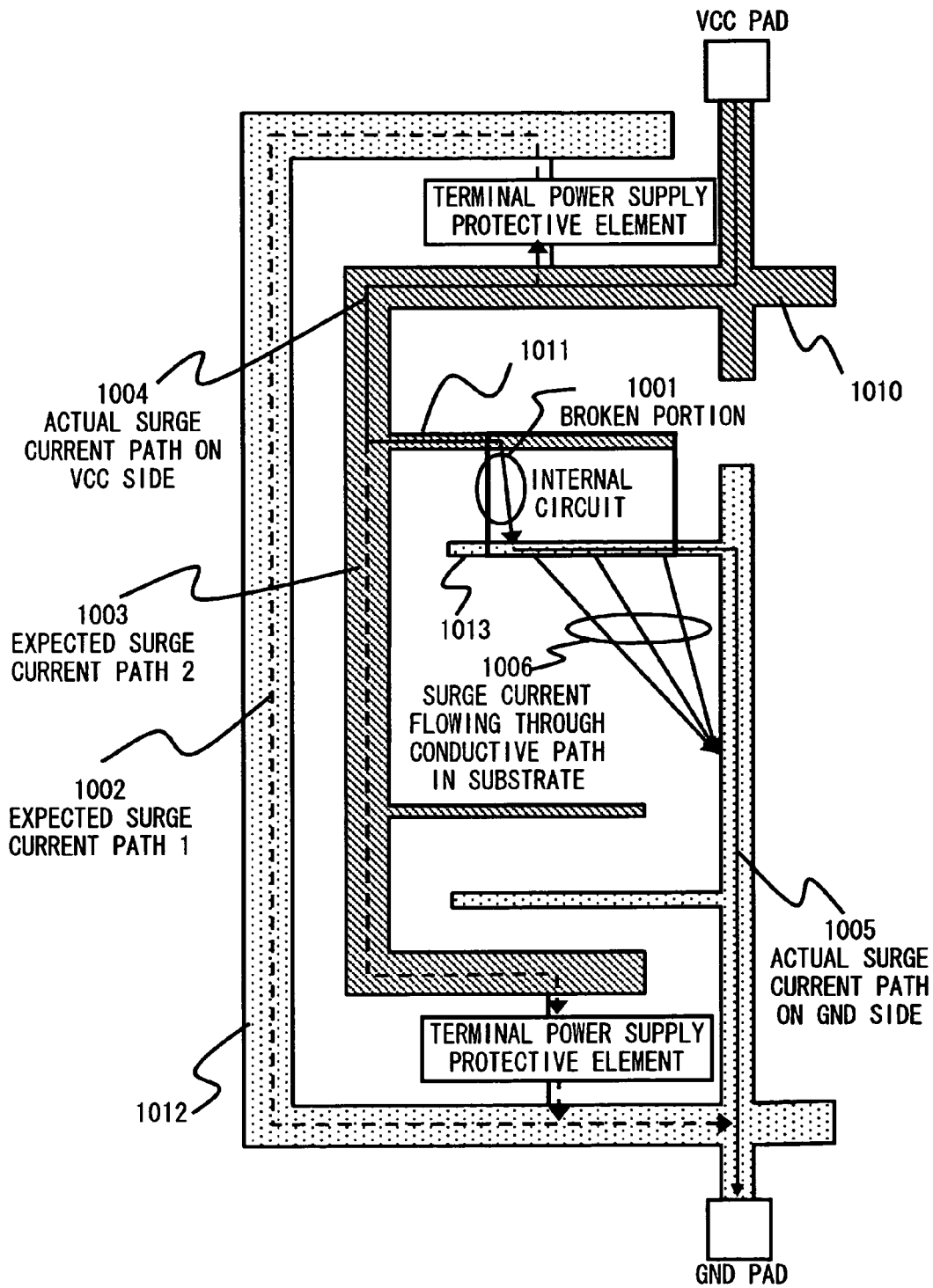
FIG. 10 shows a surge current path in the case where a surge current is supplied from a power supply terminal to flow into a ground terminal by way of an internal circuit in a conventional semiconductor device.
Figure 11:
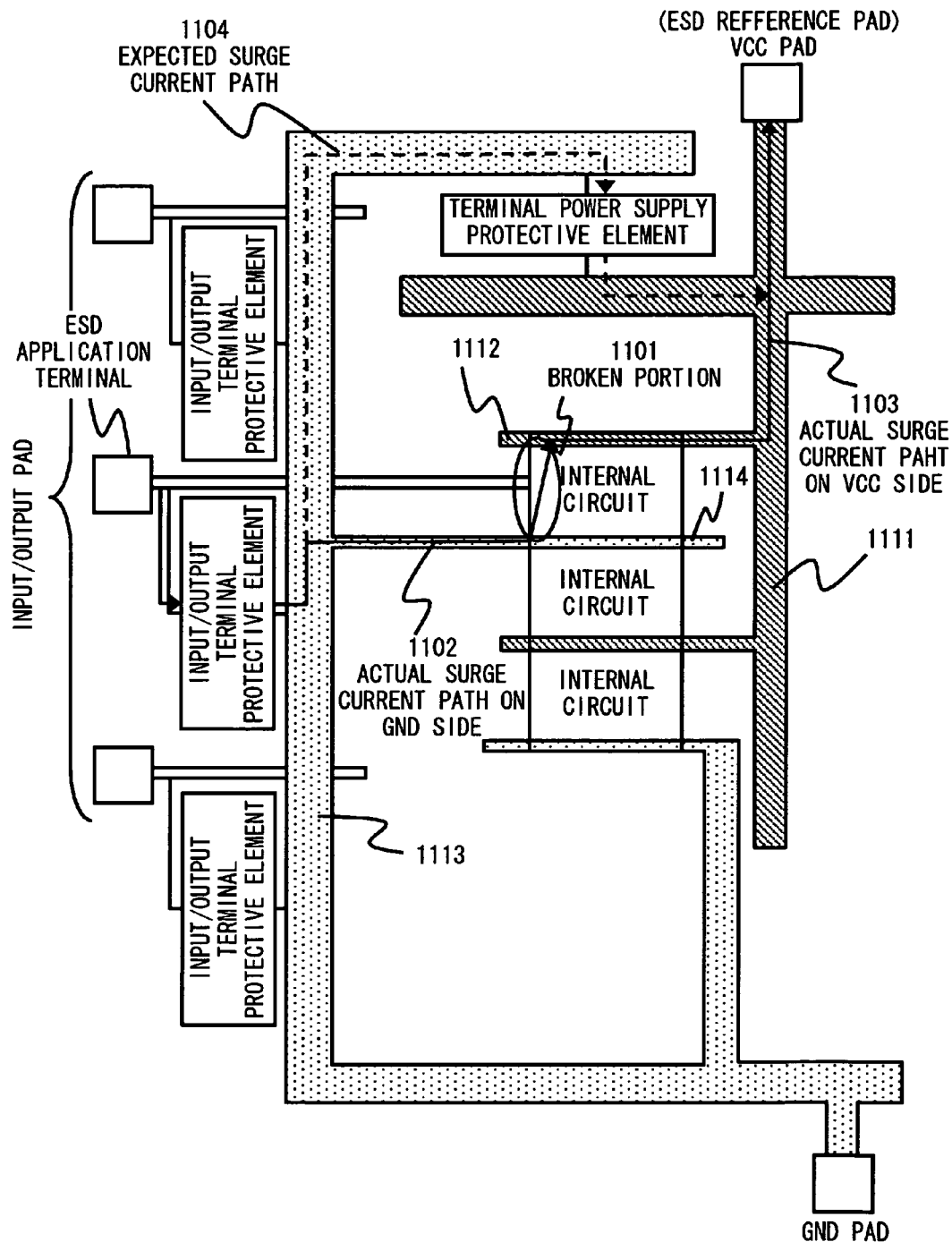
FIG. 11 shows a surge current path in the case where a surge current is supplied from an input/output terminal to flow into a power supply terminal by way of an internal circuit in a conventional semiconductor device.
Figure 12A:
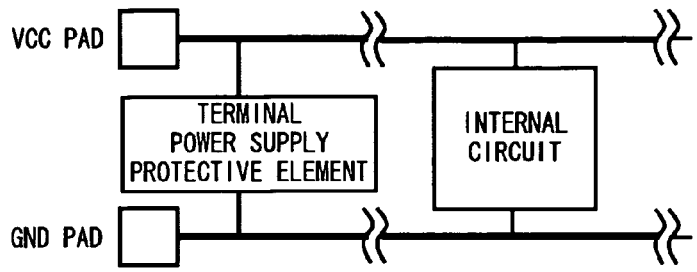
FIG. 12A schematically shows a layout of conventional protective elements.
Figure 12B:
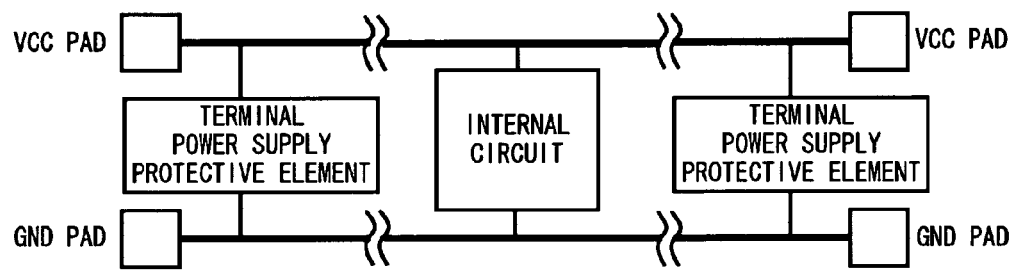
FIG. 12B schematically shows a layout of conventional protective elements.
Figure 12C:
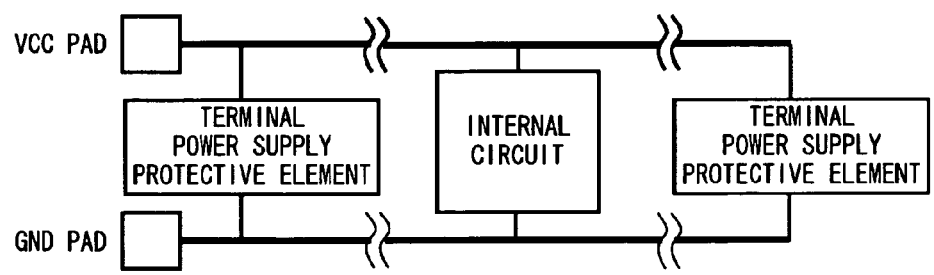
FIG. 12C schematically shows a layout of conventional protective elements.
Figure 12D:
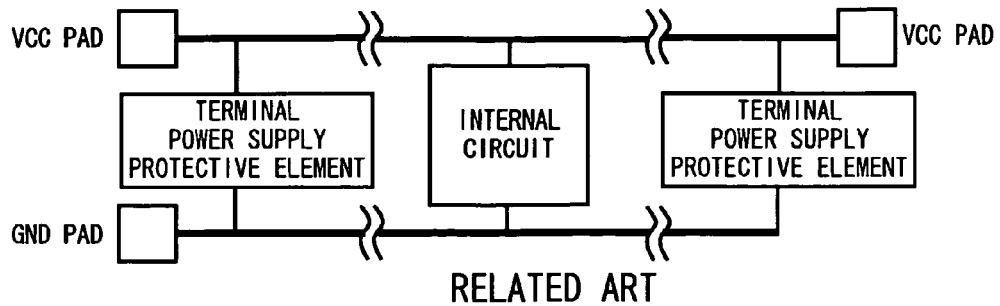
FIG. 12D schematically shows a layout of conventional protective elements.
Figure 12E:
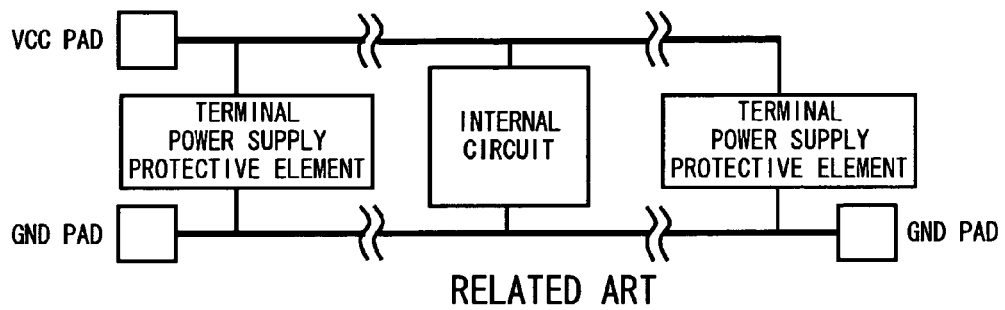
FIG. 12E schematically shows a layout of conventional protective elements.
Figure 12F:
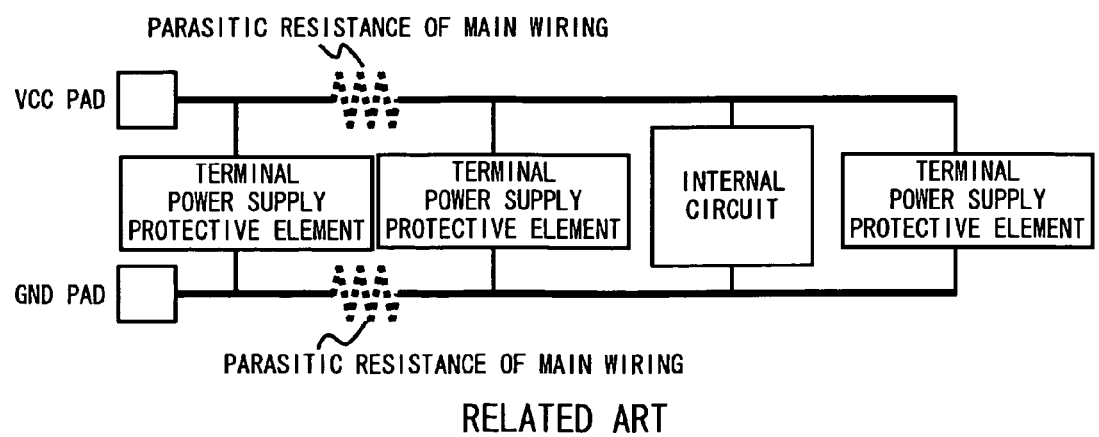
FIG. 12F schematically shows a layout of conventional protective elements.
Figure 13:
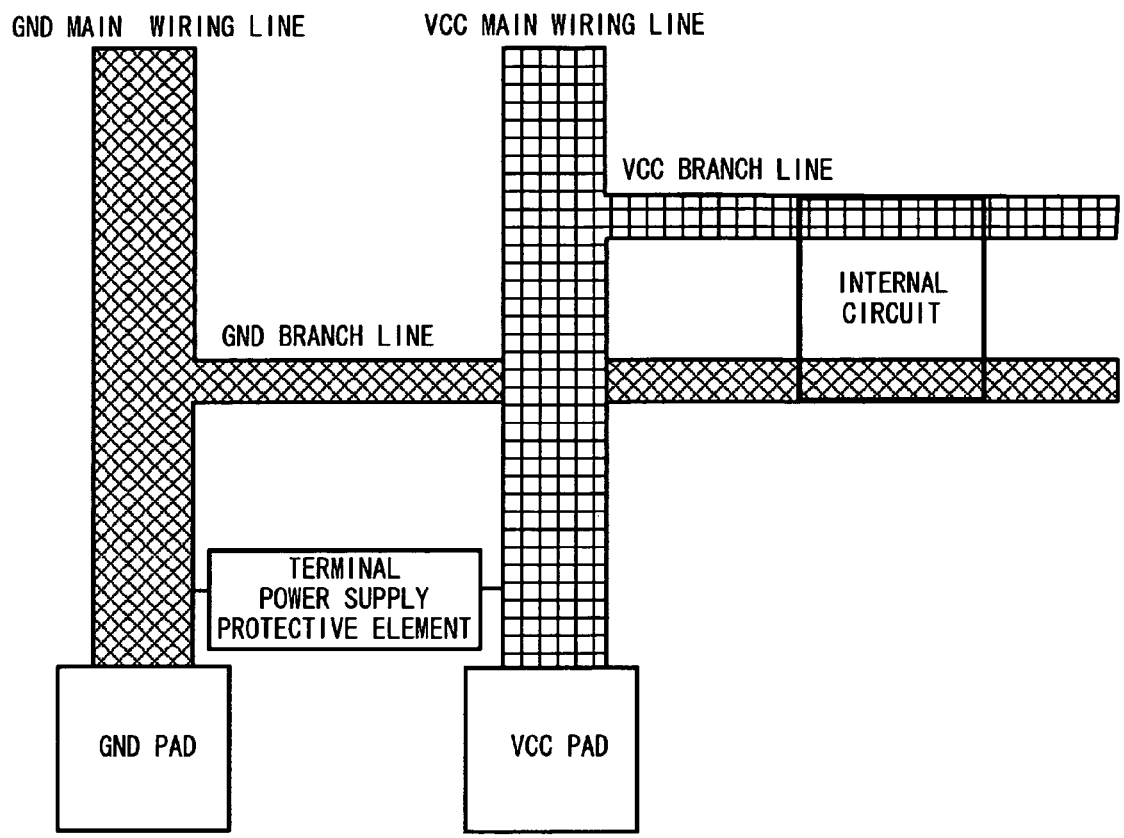
FIG. 13 shows a schematic two-dimensional layout of conventional protective elements.
Figure 14:
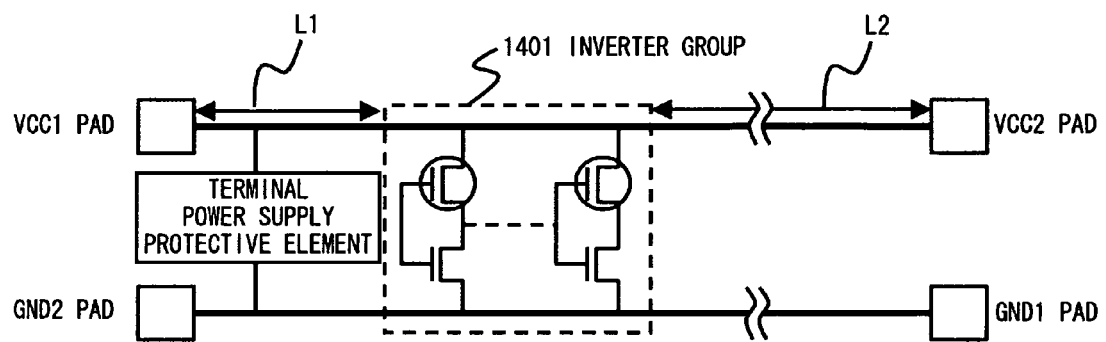
FIG. 14 is a circuit diagram of a circuit used for experiments for testing an ESD breakdown voltage.

In addition, elements and circuits used for the internal power supply protective element can be selected without particular limitations. For example, an active protective element as shown in FIG. 9, for example, a diode, an SCR, or a gg-NMOS can be used as the internal power supply protective element, and a protective element can be used therefor.

Furthermore, the above embodiments of the present invention describe the two-dimensional layout, but the present invention is applicable to a semiconductor based on multilayer interconnection. For example, if the VCC main wiring line forms a fifth layer, and the GND main wiring line forms a second layer, it is possible to adopt such a layout that the lines are connected with a branch line in the first layer.

According to the semiconductor device of the present invention, an appropriate path for a surge current resulting from the ESD is set for each of all the terminals, and the internal power supply protective element is appropriately formed in consideration of a breakdown voltage of an element and a circuit, whereby the ideal ESD breakdown voltage is enabled.

It is apparent that the present invention is not limited to the above embodiment that may be modified and changed without departing from the scope and spirit of the invention.

What is claimed is:

1. A semiconductor device having a power supply protective element that is provided near a terminal and which connects the terminal to an another terminal, comprising:
    a main wiring line connected with a power supply terminal or a ground terminal;
    a branch line that branches off from the main wiring line and applies a power supply potential or a ground potential to a functional block of the semiconductor device;
    an internal power supply protective element connected with the branch line; and
    a branching portion at which the branch line branches off from the main wiring line;
    wherein the branching portion is a contact at which the branch line branches off from the main wiring line and a line impedance per unit length is changed.

2. The semiconductor device according to claim 1, wherein the branch line applies a power supply potential or a ground potential to the functional block.

3. The semiconductor device according to claim 1, further comprising an input/output terminal protective element connected between a line connected with an input/output terminal and the main wiring line, and an internal power supply protective element connected with the branch line.

4. The semiconductor device according to claim 1, wherein the branch line extends orthogonally to a direction in which the main wiring line extends.

5. A semiconductor device having a power supply protective element that is provided near a terminal and which connects the terminal to an another terminal, comprising:
    a main wiring line connected with a power supply terminal or a ground terminal;
    a branch line that branches off from the main wiring line and applies a power supply potential or a ground potential to a functional block of the semiconductor device; and
    an internal power supply protective element connected with the branch line,
    wherein the branch line connected with the power supply terminal through the main wiring line is connected with a well region of the semiconductor device through a contact.

6. A semiconductor having a power supply protective element that is provided near a terminal and which connects the terminal to an another terminal, comprising:
    a main wiring line connected with a power supply terminal or a ground terminal;
    a branch line that branches off from the main wiring line and applies a power supply potential or a ground potential to a functional block of the semiconductor device; and
    an internal power supply protective element connected with the branch line,
    wherein the branch line connected with the ground terminal through the main wiring line is connected with a substrate region of the semiconductor device through a contact.

7. A semiconductor device having a power supply protective element that is provided near a terminal and which connects the terminal to an another terminal, comprising:
    a main wiring line connected with a power supply terminal or a ground terminal;
    a branch line that branches off from the main wiring line and applies a power supply potential or a ground potential to a functional block of the semiconductor device; and
    an internal power supply protective element connected with the branch line,
    wherein the internal power supply protective element and the functional block are formed in the same well or on the same substrate, and the semiconductor device further comprise a diffusion layer of the same conductivity type as the substrate applied with a substrate potential or applied with a well potential, between the internal power supply protective element and the functional block.

8. A method of designing a semiconductor device, comprising:
    (a) calculating an amount of current (Iesd) that flows between a power supply terminal and a ground terminal upon electrostatic discharge, a wiring resistance value (Rv) of an expected discharge path on a power supply potential side, a wiring resistance value (Rs) of an expected discharge path on a ground potential side, a clamp voltage (Vc) under operation of a power supply protective element, an effective operation resistive component (Rc) of the power supply protective element, an amount of a surge current (Iesd1) that flows into a terminal power supply protective element, and a breakdown voltage (Vx) of a gate insulating film of an internal circuit;
    (b) determining whether or not a voltage difference between a reference voltage terminal and a surge-applied terminal exceeds a gate oxide film breakdown voltage due to a surge current resulting from ESD, based on the calculation result in (a);
    (c) calculating, if it is determined in (b) that the voltage difference between the reference voltage terminal and the surge-applied terminal exceeds the gate oxide film breakdown voltage, a line resistance value (Rdv) of a predicted discharge path on the power supply potential side, a line resistance value (Rds) of a predicted discharge path on the ground potential side, an effective operation resistive component (Rdc) of the power supply protective element connected with at least one of a power supply branch line and a ground branch line, a clamp voltage (Vdc) under operation of the power supply protective element connected with at least one of a power supply branch line and a ground branch line, an amount of a surge current (Iesd1) that flows into a terminal power supply protective element upon formation of the internal power supply protective element, and an amount of a surge current (Iesd2) that flows into the internal power supply protective element; and (d) forming the internal power supply protective element in a portion where the voltage difference between the reference voltage terminal and the surge-applied terminal does not exceed the gate oxide film breakdown voltage based on the calculation result in (c).

9. The method of designing a semiconductor device according to claim 8, wherein if a relation represented by Expression 1:

$$Iesd(Rv+Rs+Rc)+Vc>Vx \qquad \text{Expression 1}$$

is met, (b) the determining includes connecting at least one of the power supply branch line and the ground branch line with the internal power supply protective element.

10. The method of designing a semiconductor device according to claim 8, wherein (d) the forming includes connecting at least one of the power supply branch line and the ground branch line with the internal power supply protective element that satisfies Expression 2:

$$Iesd1(Rv+Rs+Rc)+Vc<Iesd2(Rdv+Rds+Rdc)+Rdc<Vx \qquad \text{Expression 2.}$$

11. The method of designing a semiconductor device according to claim 9, wherein (b) the determining includes deciding that no internal power supply protective element is provided if the relation represented by Expression 1 is not met.

* * * * *

UNITED STATES PATENT AND TRADEMARK OFFICE
CERTIFICATE OF CORRECTION

PATENT NO. : 7,660,085 B2  
APPLICATION NO. : 11/358226  
DATED : February 9, 2010  
INVENTOR(S) : Furuta et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 545 days.

Signed and Sealed this

Thirtieth Day of November, 2010

David J. Kappos  
*Director of the United States Patent and Trademark Office*